United States Patent [19]

Kuhn

[11] Patent Number: 4,901,293

[45] Date of Patent: Feb. 13, 1990

[54] RARE EARTH FLEXTENSIONAL TRANSDUCER

[75] Inventor: Philip M. Kuhn, Severna Park, Md.

[73] Assignee: Martin Marietta, Orlando, Fla.

[21] Appl. No.: 65,183

[22] Filed: Jun. 24, 1987

Related U.S. Application Data

[63] Continuation of Ser. No. 683,697, Dec. 19, 1984, abandoned.

[51] Int. Cl.$^4$ ............................................. H04R 15/00
[52] U.S. Cl. ....................................... 367/168; 310/26
[58] Field of Search ............... 367/156, 168, 184, 185; 381/190; 310/26; 73/DIG. 2

[56] References Cited

U.S. PATENT DOCUMENTS

| | | | |
|---|---|---|---|
| 2,076,330 | 6/1937 | Wood | 367/168 |
| 2,468,270 | 1/1949 | Olson et al. | 367/168 |
| 2,607,814 | 8/1952 | Bloch | 333/201 |
| 3,160,769 | 12/1964 | Abbott | 310/26 |
| 3,174,130 | 3/1965 | Woollett | 367/168 |
| 3,177,382 | 4/1965 | Green | 310/334 |
| 3,263,768 | 8/1966 | Zepernick | 367/168 |
| 3,484,630 | 12/1969 | Schwartz | 367/168 |
| 3,906,435 | 9/1975 | Lamel et al. | 175/50 X |
| 4,158,964 | 6/1979 | McCrea et al. | 73/290 V |
| 4,287,582 | 9/1981 | Tocquet | 367/155 |
| 4,308,603 | 12/1981 | Overby, III | 367/141 |
| 4,384,351 | 5/1983 | Pagliarini, Jr. et al. | 367/163 X |
| 4,438,509 | 3/1984 | Butler | 367/156 |
| 4,541,081 | 9/1985 | Smith | 367/168 |
| 4,642,802 | 2/1987 | Pozzo et al. | 367/156 X |
| 4,658,091 | 8/1987 | Chun et al. | 367/75 X |
| 4,703,464 | 10/1987 | Howorth et al. | 367/156 |

OTHER PUBLICATIONS

Anderson, N. A., Cobalt Rare-Earth High Energy Permanent Magnet, Electronic Components & Applications, vol. 5, #4, pp. 194–199, Sep. 1983.

Meeks, Steven W., The Equivalent Circuit in the Mobility Analogy of a Magnestostrictive Transducer in the Presence of Eddy Current, Naval Research Laboratory Report 8294, 3/26/79, pp. 1–38.

Woolett, Ralph S., Relation of Basic Properties to Operating Transducer Parameters, U.S. Navy of Underwater Acoustic, vol. 27, #1, (1977), pp. 25–37.

Butler, "Rare Earth Iron Octagonal Transducer", J. Accoust. Soc. Am., vol. 67, No. 5, May 1980, pp. 1809–1811.

Smith et al., "Design of a Transducer Using Rare Earth Magnetostrictive Materials", U.S. Navy Journal of Underwater Acoustics, vol. 27, No. 1, Jan. 1977, pp. 175–181.

"Design of a Rare Earth Driven Air Backed Flextensional", Gerald A. Brigham, Technical Report A-10-3–83, Aquasonics, Inc., New Hampshire, May 18, 1983.

"Present Status in Flextensional Transducer Technology", G. Brigham et al, J. Acous. Soc. Am. 68(4), Oct. 1980, pp. 1046–1052.

"Calculation of the Directivity Index for Various Types of Radiators", C. T. Mollov, Journal of the Acoustical Society of America, vol. 20, No. 4, Jul., 1948, pp. 387, 392.

"Analysis of the Class-IV Flextensional Transducer by Use of Wave Mechanics", Gerald A. Brigham, Journal of the Acoustical Society of America, vol. 56, No. 1, Jul. 1974.

"Formulas for Stress and Strain", Raymond J. Roark et al, pp. 188, 189.

NUSU Report, TR 4463, pp. 53–56.

"Physical Acoustics", Warren P. Mason, Bell Telephone Laboratories, Incorporated, vol. 1–Part A, 1964, pp. 263–267.

*Primary Examiner*—Brian S. Steinberger
*Attorney, Agent, or Firm*—Staas & Halsey

[57] ABSTRACT

A flextensional transducer driven by magnetically biased rare earth rods 31. The rods 31 are arranged in stacks with rare earth magnets 34 mounted on each end of each stack for providing the bias field. The rods 31 are slotted to reduce eddy currents and surrounded by a slotted drive coil 32 with a slot 32a in the coil bobbin. The ends of the flextensional shell associated with the shell major axis have a full radius curvature which stiffens the shell ends so that the axial bias and drive forces will not break the rare earth magnets 34 in flexure.

19 Claims, 13 Drawing Sheets

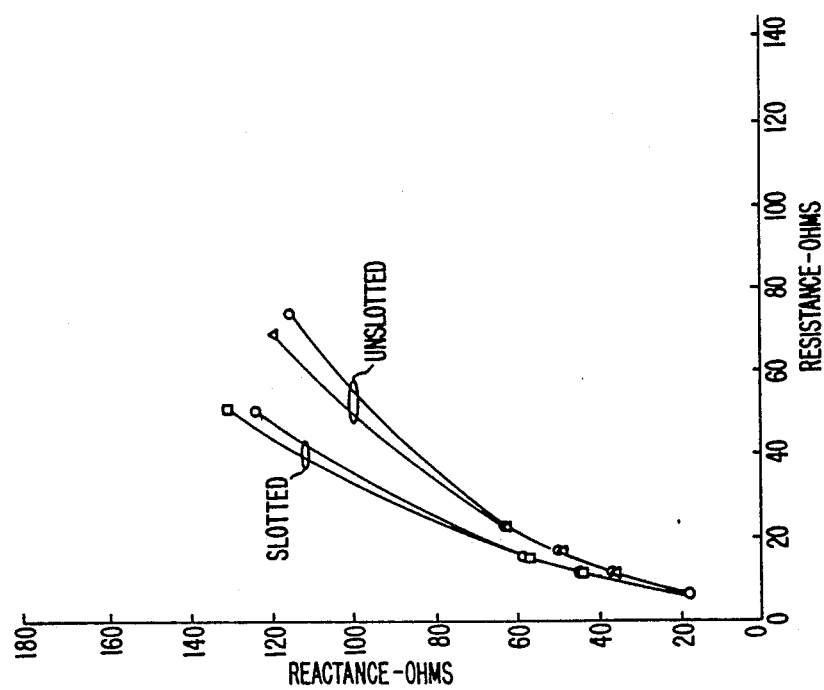
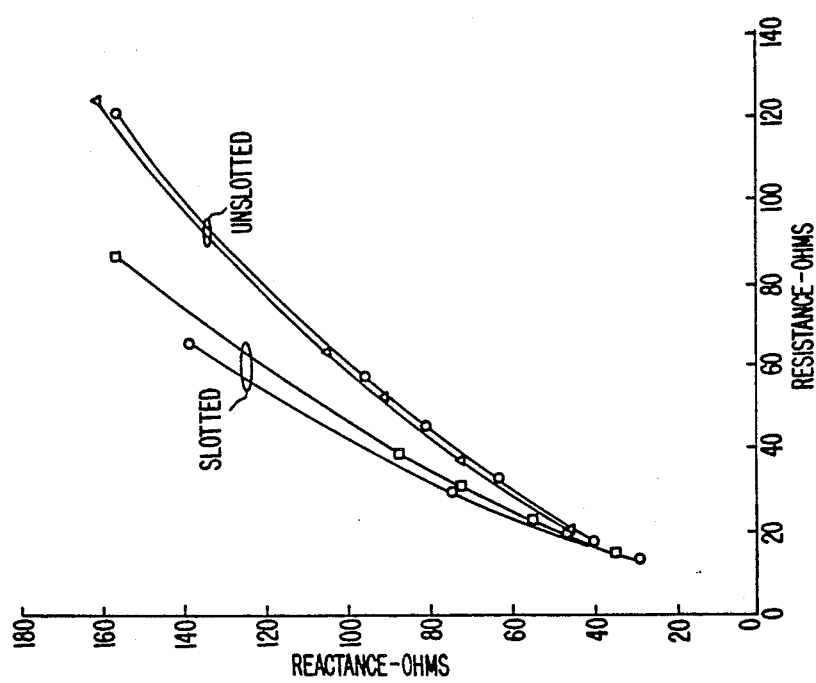

RARE EARTH FLEXTENSIONAL TRANSDUCER

This is a continuation of co-pending application Ser. No. 683,697 filed on Dec. 19, 1984, now abandoned.

BACKGROUND OF THE INVENTION

1. Field of the Invention

The present invention is directed to a rare earth magnetostrictive driven flextensional transducer and, more particularly, to a flextensional transducer in which rare earth drive rods are biased by rare earth magnets.

2. Description of the Prior Art

Flextensional transducers are a class of mechanical amplifiers that use a drive bar to expand a pseudo elliptical shell, having a minor to major axis ratio of about 0.4, in the direction of the major axis. The expansion by the shell along major axis causes the shell to deform or deflect along the minor axis. The deflection associated with the minor axis is magnified and out of phase with the expansion along the major axis and causes sound waves to be produced. A prior art example of a flextensional shell 10 driven by a ceramic bar 11 is illustrated in FIG. 1. When the electrodes (not shown) of the individual blocks (not shown), stacked to form the ceramic bar 11, are excited with a driving voltage, the ceramic bar expands or contracts along the Y axis causing the shell 10 to contract or expand, respectively, along the X axis. Such a ceramic transducer experiences high loss at the elevated temperatures associated with high driving levels.

FIG. 2 illustrates a prior art folded horn transducer in which the bell-shaped housing 20 is driven by rare earth magnetostrictive rods 21 excited by solenoids 22. The solenoids are wired in series and magnetically coupled by magnetic couplers 23 so that a return flux path is created. The rods are mechanically biased using stress plates 24 and stress bolts 25. The housing 20 includes a gap 26 which allows each housing 20 to ring like a bell. The transmitting voltage response of the folded horn transducer of FIG. 2 is illustrated in FIG. 3A. If ceramic rods are substituted for the rare earth rods 21, a transmitting voltage response as illustrated in FIG. 3B will result. This type of transducer, as illustrated by FIGS. 3A and 3B, has relatively low output levels.

SUMMARY OF THE INVENTION

It is an object of the present invention to provide a transducer having a source level output of at least 200 dB.

It is another object of the present invention to provide a transducer having a minimum rise in internal temperature allowing a longer duty cycle at higher power levels.

It is an additional object of the present invention to provide a transducer with an improved output versus weight ratio.

It is a further object of the present invention to provide a transducer having an output which is linear with changes in drive current.

It is an additional object of the present invention to reduce insulation requirements in transducers driven at high power levels.

It is still another object of the present invention to provide a transducer capable of withstanding high temperatures without degradation in performance.

It is another object of the present invention to provide a transducer with greater acoustic power than is producible by a piezoelectric ceramically driven transducer.

It is an additional object of the present invention to provide a low frequency transducer with high output source levels.

It is a further object of the present invention to provide transducers in which electrical input impedance can be adjusted without affecting the intrinsic mechanical properties of the transducer.

It is a further object of the present invention to provide a transducer which will operate at high temperature without permanent changes occurring in the drive rods therein.

The above objects are accomplished by a flextensional transducer driven by magnetically biased rare earth rods. The rods are arranged in stacks with rare earth magnets mounted on each end of each stack for providing the bias field. The rods are slotted to reduce eddy currents and surrounded by a drive coil with a slotted coil bobbin. The ends of the flextensional shell associated with the shell major axis have a full radius curvature which strengthens the shell so that it will handle the increased drive force produced by the highly driven rare earth rods.

These, together with other objects and advantages which will be subsequently apparent, reside in the details of the construction and operation of the transducer as more fully hereinafter described and claimed, reference being had to the accompanying drawings forming a part hereof, wherein like numerals refer to like parts throughout.

BRIEF DESCRIPTION OF THE DRAWINGS

FIG. 11A illustrates the characteristics of slotted rod versus unslotted rods absent a magnetic bias field; FIG. 11B illustrates the characteristics of slotted rod 31 versus unslotted rods in a biasing magnetic field.

DESCRIPTION OF THE PREFERRED EMBODIMENT

Figure 4:
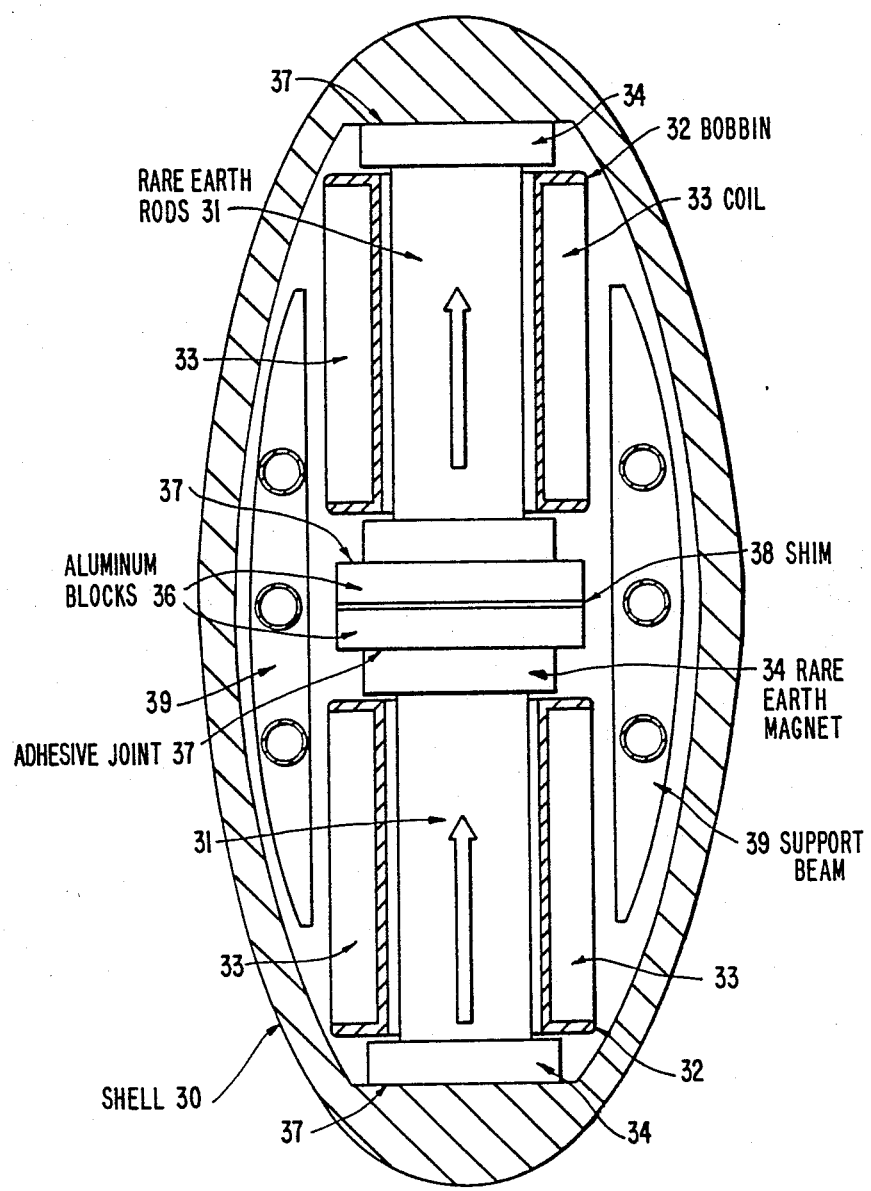
FIG. 4 is a cross sectional end view of a rare earth flextensional transducer in accordance with the present invention.

FIG. 4 is a cross sectional end view of a rare earth flextensional transducer in accordance with the present invention. The transducer has an aluminum flextensional shell 30 having a major axis 6.8 inches high, a minor axis 3.1 inches wide and a shell 6.0 inches deep into the page. The shell 30 is driven along the major axis by four stacks (only two are shown in this end view) of rare earth rods 31 of Terfenol D composition Fe (1.95), Tb(1−x), Dy(x) where x is less than 0.8 and greater than 0.5. The stack is surrounded by an excitation coil 33 wound on a coil bobbin 32 and the coils 33 are connected in parallel when the transducer is driven. A magnetic bias is applied to the rare earth rods 31 by permanent rare earth magnets 34 produced by Jobmaster Corporation having designation Jobmax E1. A compressive mechanical bias is applied to the rods 31 by the elastic spring of the flextensional shell 30 and is adjusted by shim 38. Aluminum end caps 40, discussed later, which suspend the shell 30 by its edges are rigidly connected to each other by two internal end cap support beams 39. On one of the end caps 40, two high current waterproof connectors 43 are connected to stranded waterproof cables.

The operation of the transducer begins instantaneously with the application of electric current to the excitation coils 33. The current in each coil 33 causes a magnetic field to be generated in the rare earth rods 31 in a direction parallel to the cylindrical axis of the coil 33. The magnetic field causes the rare earth rods 31 to develop internal stress in the same direction as the applied field The net effect of the internal stress is to apply an equal and opposite force to each interior end of the long or major axis of the flextensional shell 30 oval. The forces on the interior of the elastic shell 30 cause the shell 30 to deform along the major axis causing a minor axis deflection that is magnified and out of phase with the former This secondary deflection causes sound waves to be generated in the medium surrounding the exterior of the flextensional shell 30. The deflections along the major axis of the shell also produce sound, but at a much diminished amplitude. The transducer can also operate as a receiver where the sound waves in the medium cause the reverse chain of events to generate an electrical output at the excitation coil terminals of the transducer.

Figure 1:
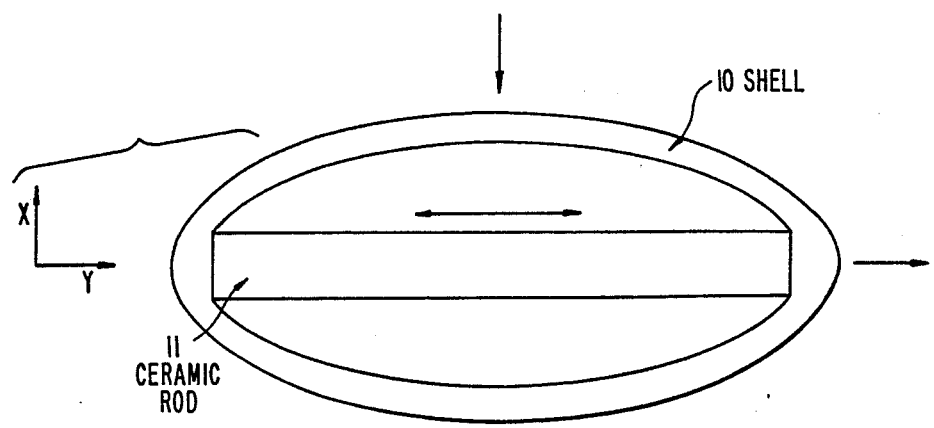
FIG. 1 is a simplified diagram of a prior art flextensional transducer driven by a ceramic bar 11.
Figure 2:
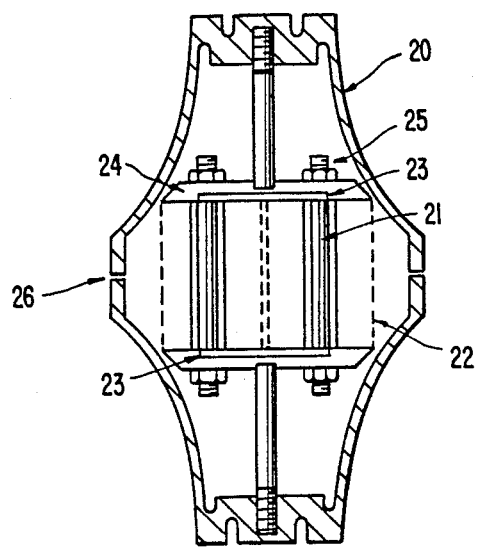
FIG. 2 is an example of a prior art folded horn transducer driven by rare earth magnetostrictive rods.
Figure 3A:
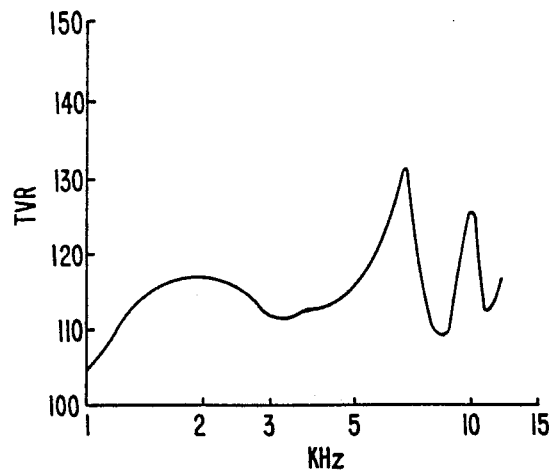
FIG. 3A is a graph of the transmitting voltage response of the transducer illustrated in FIG. 2.
Figure 3B:
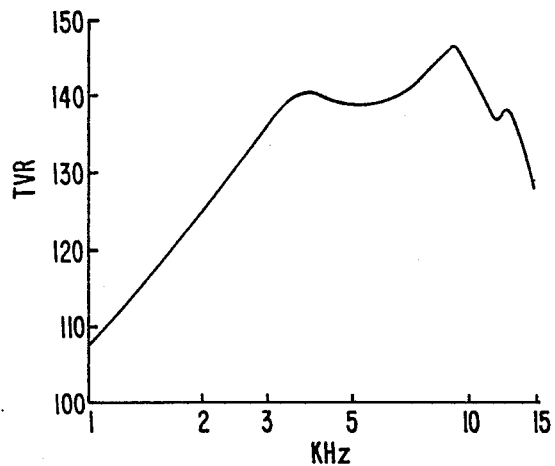
FIG. 3B is a graph of the transmitting voltage response of the transducer of FIG. 2 using piezoelectric ceramic drive rods.
Figure 5:
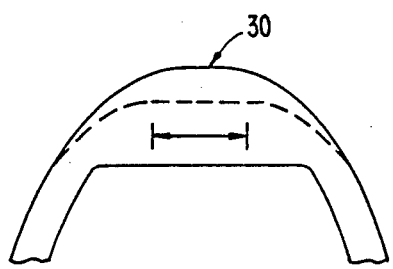
FIG. 5 is a detailed view of a major axis end of a flextensional transducer which compares a prior art shell end structure with the shell 30 end structure according to the present invention.
Figure 6A:
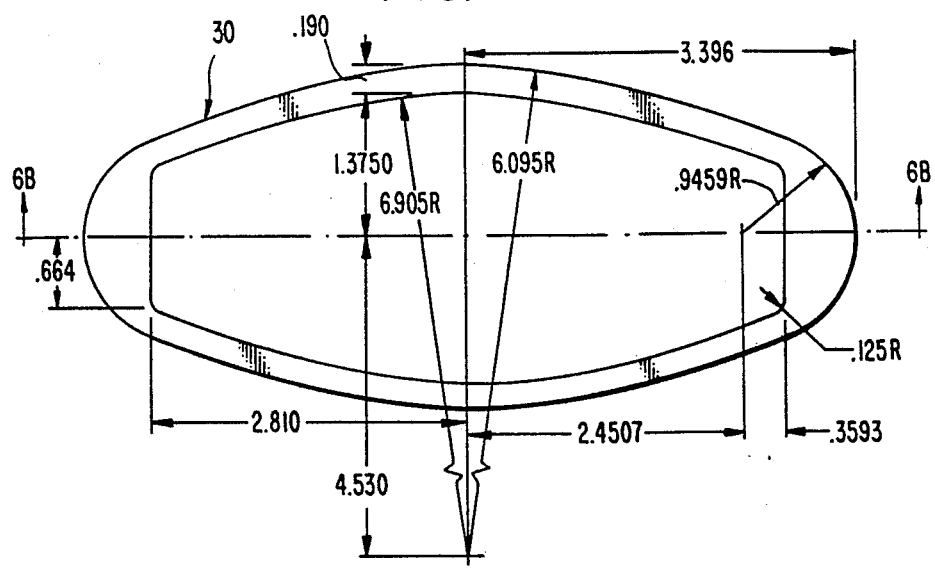
FIG. 6, including 6A and 6B illustrates the dimensions of a flextensional shell 30 according to a preferred embodiment of the present invention.
Figure 6B:
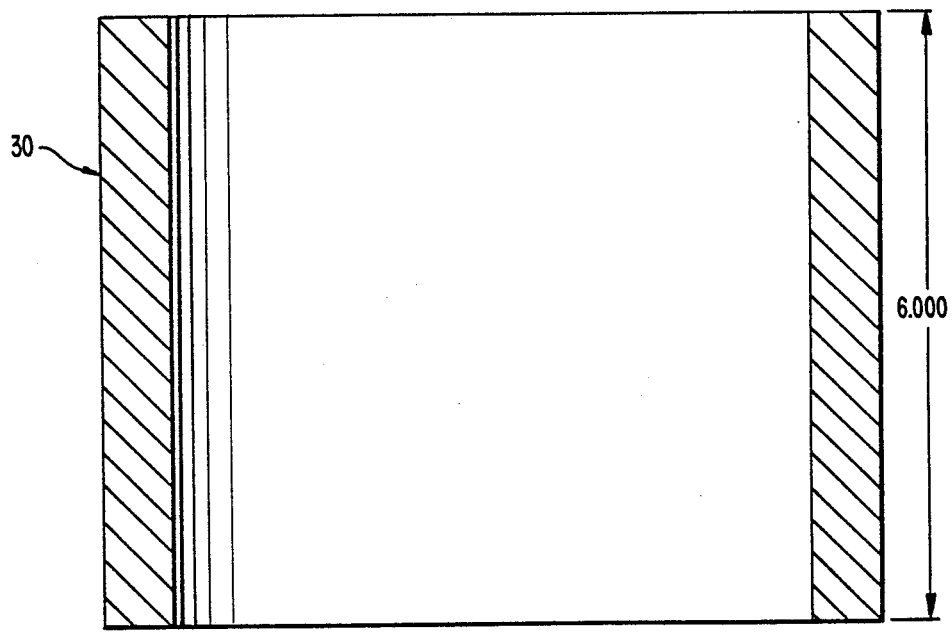

The force transmitted to the shell 30 by the excited rods 31 causes a great deal of flexing stress to be applied to the shell through the rare earth magnets 34. This flexure is significantly great in the ends of the shell 30 such that sympathetic magnet 34 flexure may cause the magnet to fail. To prevent such failure, the beam stiffness of the major axis ends of the shell 30 had to be increased as compared to the prior art flextensional shells. This increase in the beam strength was accomplished by providing a full radius exterior surface for the shell 30, as illustrated detail in in FIG. 5. The shape of the prior art flextensional shell is illustrated by dashed lines in FIG. 5 and includes a straight section, designated by a double ended arrow, which weakens the end and allows undesirable flexing of the end to occur. The present shell 30 has increased beam thickness and stress failures in the magnet will not occur. Actual measurements for the preferred embodiment of the shell 30 of the present invention are illustrated in FIG. 6.

Figure 7:
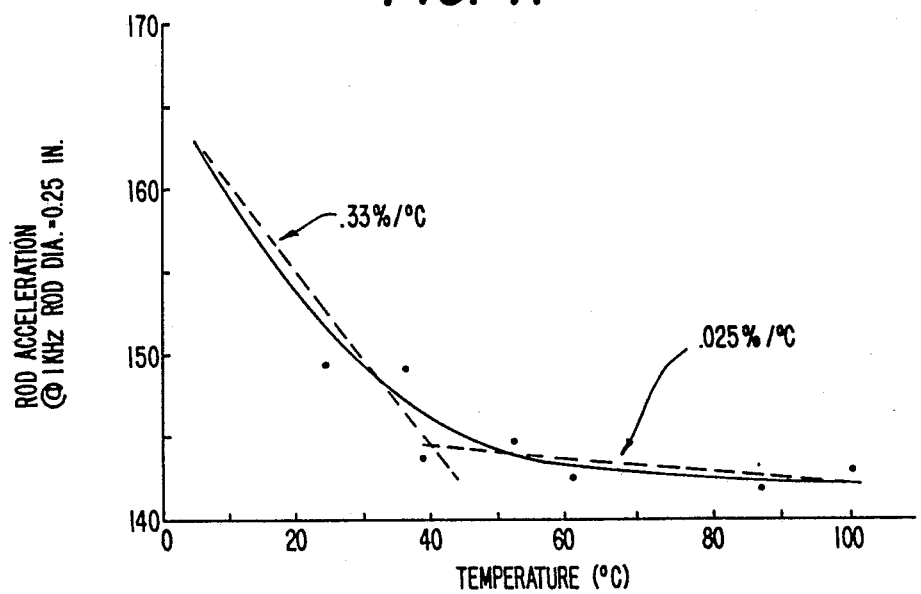
FIG. 7 illustrates temperature versus acceleration for rare earth rods 31.
Figure 8:
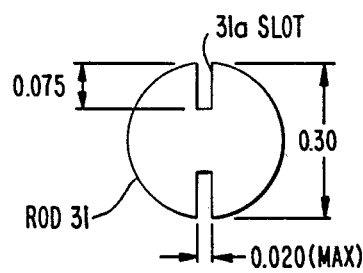
FIG. 8 illustrates a rare earth rod 31 in detail.
Figure 9A:
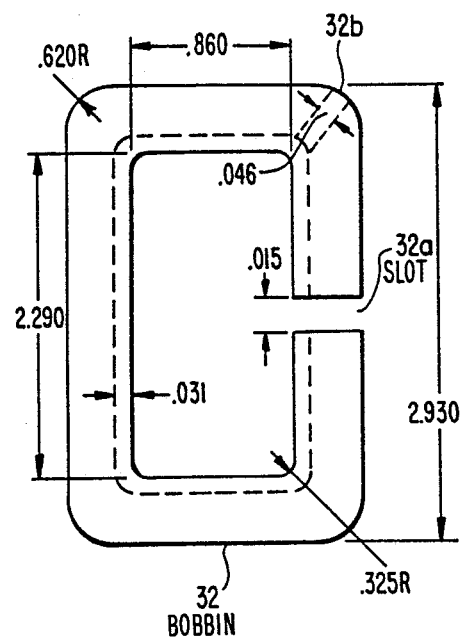
FIG. 9, including 9A and 9B provides the dimensions of a coil bobbin 32 in accordance with the present invention.
Figure 9B:
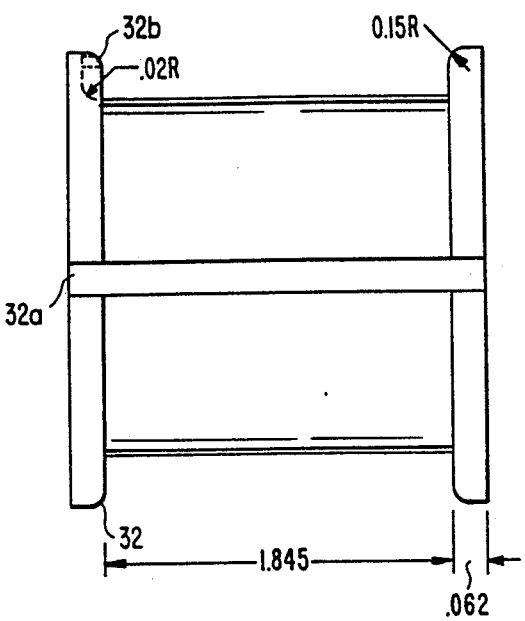

Rare earth rods of the Terfenol D composition were chosen because of their increased strain capability as compared to ceramic rods 31, and for their increased stability in the low temperature environment in which a transducer is expected to start operation and the higher internal temperature at which continuous operation is expected. FIG. 7 illustrates the predictable acceleration and, thus, the strain output of the rods 31 at both low and high temperatures. Part of the temperature rise in the rods 31 is caused by eddy current losses occurring in the rods 31 during excitation. In order to reduce the eddy current loses in the rods 31, the rods 31 were slotted, as illustrated in FIG. 8. The slots 31a essentially reduce circulating currents in the rods by breaking the conduction path therein. In the present embodiment, slotted rods 31 are used in each coil 33 and, as an alternative, a greater number of smaller diameter unslotted rods could be used as long as the effective diameter of the rods is approximately 0.15 inches or less. The rods 31 are surrounded by a machined aluminum coil bobbin 32. A slot 32a is provided which runs the length of the coil and avoids a shorted turn. Aluminum is the preferred bobbin 32 material because of its high thermal conductivity, even though it can still be somewhat lossy due to unquenched eddy currents. The coils are each wound with approximately 450 turns of No. 20 magnet wire. The wire end which starts the bottom layer is routed out through wire slot 32b. The resulting coil has an approximate resistance of 2.24 ohms. FIG. 9 illustrates the measurements of the machined aluminum coil bobbin 32.

Figure 10:
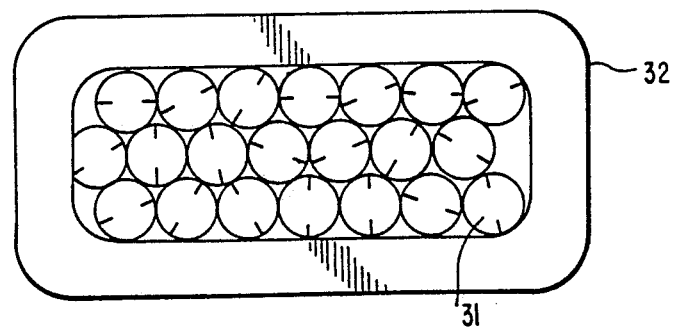
FIG. 10 is an end view of an assembled bobbin 32 and rods 31 in combination.

FIG. 10 illustrates an end view of a bobbin 32 loaded with rods 31. The ends of the rods are covered with rare earth biasing magnets 34 and provide a bias to the rods 31 which insures linear operation of the rods 31. The rods 31 should be of such a length that the magnets 34 can apply a bias throughout the length of the rods 31.

FIGS. 11A and 11B both illustrate the enhanced performance of the rods 31 when slotted as compared to unslotted and when biased (FIG. 11B) as compared to unbiased (FIG. 11A).

The transducer construction process begins by cutting the rods 31 to an approximate length of 1.05 inches. This length allows the entire length of the rods to be magnetically biased by the selected rare earth magnets 34. If magnets 34, with a different strength magnetic field are provided, the rods can be lengthened or shortened accordingly. The rods 31 are then slotted as illustrated in FIG. 8. The machined bobbin 32 is then produced and the slot 32a is filled with three thicknesses of GE mica and held in place by epoxy. After the epoxy has cured, the interior surface of the bobbin 32 on which the first layer of wire is wound is lined with Permacel electrical tape No. P221, a self-adhesive Kapton tape having an overall thickness of 2.5 mils and a Kapton thickness of 1 mil. The tape is applied in one layer and trimmed so that no overlap occurs. The bobbin is then wound with approximately 450 turns of No. 20 AGW thermamid (REA-HTAI) magnet wire. The tension in the winding process causes the bobbin slot 32a to extrude the mica laminant which then must be trimmed flush. The bobbin 32, after being wound with the magnet wire, is dip-coated with an insulating varnish (DOLPHS No. BC-340) and dried for three hours at 300° F. in an oven. The coil wires are sleaved with Teflon for greater insulation and the wires are taped in place by a closely woven thermo-setting pressure-sensitive adhesive which is overlapped on the ends to provide a retaining band. Eight inch lead wires are left attached to the coils.

Because the length of the rods 31 varies slightly, it is necessary to apply a joint filling cement with sufficient stiffness at high temperatures to the ends of the rods 31. The joint filling cement includes Epon 828 resin and a crystalline silicon ($SiO_2$) filler that has a small particle size. Tammsco Silver Bond B media can be used as the filler and is mixed with the resin at a resin to filler ratio of 1 to 1.75. Trimellitic anhydride is added to the above mixture as a curing agent in a ratio of resin to curing agent of 1 to 0.33. The trimellitic anhydride must first be dispersed in acetone before mixing with the resin and then the acetone is evaporated in a vacuum oven before the resulting paste is used. After application, the joint cement must be cured for one hour at 250° F. and then for two hours at 350° F. The 1.75 ratio is preferred to other ratios because this allows the epoxy to act more like mortar during compression.

After preparation of the joint cement, the drive units can be assembled. Twenty-one rare earth rods 31 are loaded into a coil bobbin 32 and a rare earth magnet 34 is held against the ends of the rods 31. The stack is then inverted and the joint cement is applied to the exposed rods 31. A second magnet is then lined up in polarity with the first magnet and dropped carefully into place. The glued magnet is then "rung" to the rod ends to reduce the joint thickness. The glued assembly is then reinverted and the first magnet is reinstalled with a glued joint, as previously described, while ensuring that the magnetic polarity of the reinserted magnet remains the same. After the magnets are centered in the coil and the glued joints were cured in accordance with the schedule previously discussed, magnet alignment should be checked. Prior to insertion of the two drive assemblies into the shell 30, illustrated in FIG. 4, aluminum blocks 36 are glued to each drive assembly. Two drive assemblies are then stacked on top of each other with the aluminum blocks facing. The magnetic sense of each pair of stacked assemblies must be oriented in the same direction, as illustrated by the arrows in FIG. 4. However, adjacent pairs of stack assemblies may have magnetic sense orientations pointing in the opposite direction to form a return flux path. Before insertion into the shell 30, the top and bottom of each pair of stack assemblies is coated with the joint cement to form an adhesive joint 37 at each interface with the shell 30, as illustrated in FIG. 4.

Before the pair of stacked drive assemblies can be inserted into the flextensional shell 30, the minor axis of the shell 30 must be compressed with approximately 800 pounds of force so that sufficient insertion clearance is provided for the pair of stacked drive assemblies. Once the drive assemblies are in place, the minor axis force is relaxed and the transducer is placed into an oven for curing of the adhesive joints 37 in accordance with the previously discussed schedule.

Figure 12:
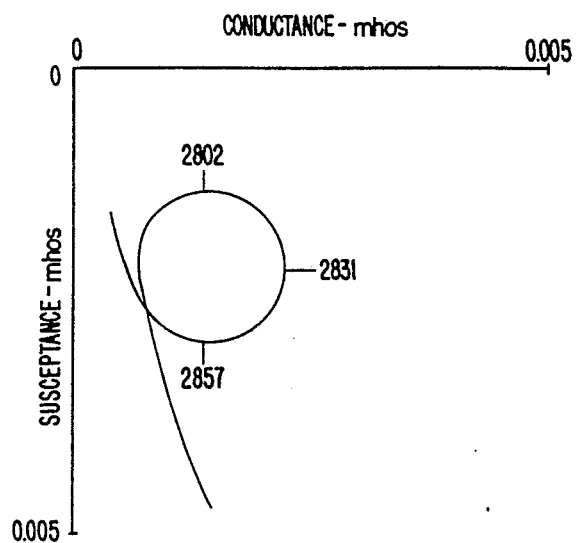
FIG. 12 is an example of a graph used to adjust a mechanical bias of the assembled transducer.

After oven curing, the transducer is then again squeezed along the minor axis to open the region for insertion of shim 38. The coils 33 are connected in series and vector admittance plots for the coils 33 are produced as illustrated in FIG. 12. The shim 38 thickness is gradually increased until the size of the admittance loop indicates the proper mechanical bias point. As the shim thickness is increased, the size of the admittance loop will expand or remain constant until the proper stress point is reached. When the proper stress point is reached, the diameter of the admittance loop no longer increases with additional shimming, but very slightly decreases. This prestressing using the shim 38 allows the transducer to operate at varying depths without degradation in performance due to the unstressing of the stack by increased hydrostatic pressure applied to the shell 30 exterior. A shim 38 of approximately 0.0312 inches will allow the transducer to operate under hydrostatic pressure of 135 pounds per square inch which corresponds to a submergence depth of approximately 300 feet. A depth of approximately 60 feet is necessary to operate this high output transducer a power without cavitation.

Figure 15:
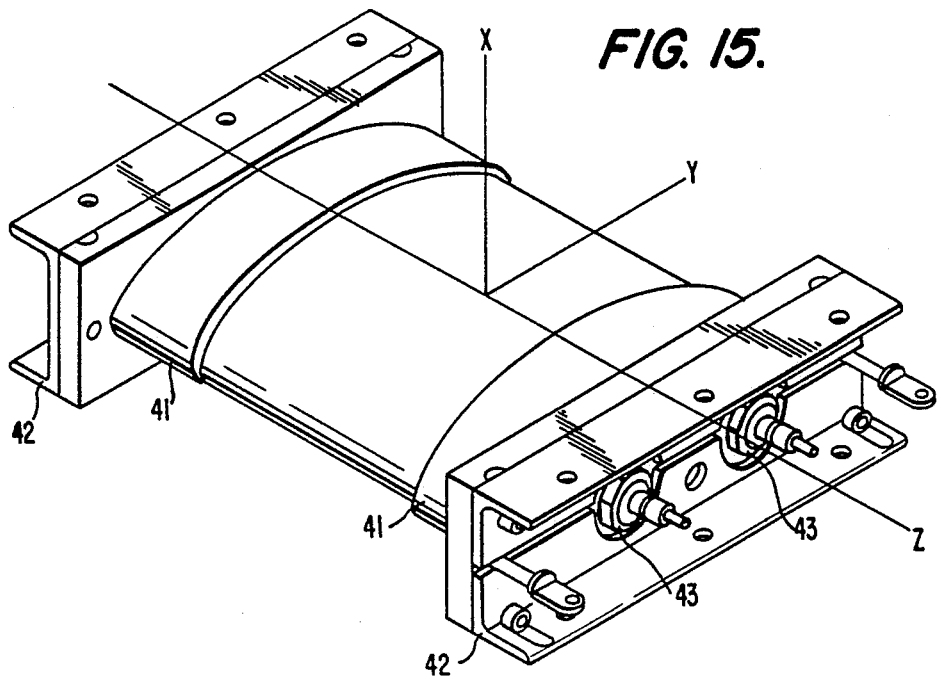
FIG. 15 depicts an assembled transducer.

The space between the coil bobbins 32 and permanent magnets 34 is partially filled with an RTV silicon material (Dow Corning 3110 RTV with curing agent catalyst F). The support beams 39 and end caps 40 are then assembled with the shell 30 by applying neoprene rubber gaskets to the end caps 40 which are then applied to the aluminum shell 31 end surfaces using the end cap support beams 39. The transducer is then clamped across the end caps 40 to stabilize the gasket while it is cured. Next, joint bands 41 of one inch width neoprene are applied to the joints between the end caps and the flextensional shell using uncured neoprene and the neoprene bands 41 are clamped and cured. In order to obtain a proper output response, the neoprene bands 41 should be no more than one-sixteenth of an inch thick. Extra thickness can be removed using a belt sander. Thereafter, mounting brackets 42 are attached to the end caps 40 and waterproof connectors 43 are inserted, and the assembled transducer appears as illustrated in FIG. 15. The transducer then needs to be tested for water leakage and proper operation by insertion into a pressurized tank and applying a driving signal of 20.5 KVA with a real power of 8,525 watts to test the transducer at an output of 200 dB. The transducer should also be tested for leakage resistance and should have a reading of 10 gigaohms at 1,000 volts DC. During testing and operation to achieve maximum performance, the coils should be connected in parallel.

Figure 16:
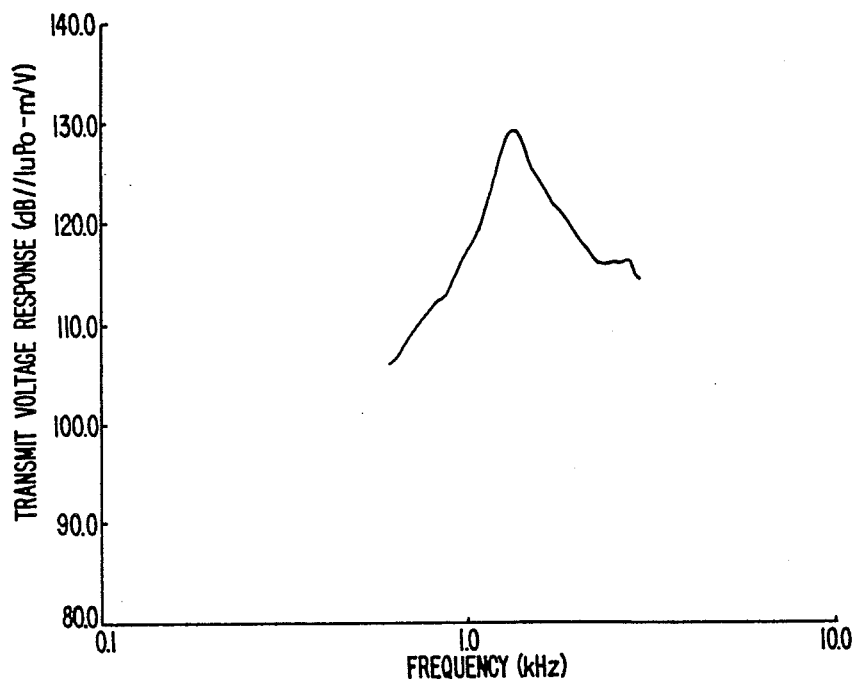
FIG. 16 is a graph of the transmitting voltage response of a piezoelectric ceramically driven transducer.
Figure 17:
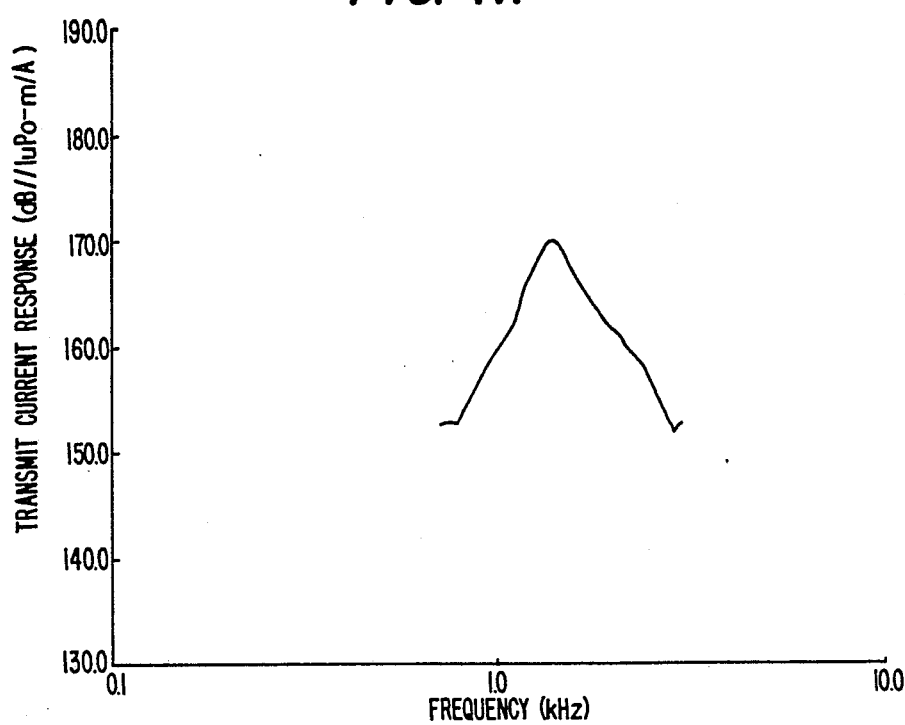
FIG. 17 illustrates the transmitting current response of a rare earth driven transducer according to the present invention.
Figure 18:
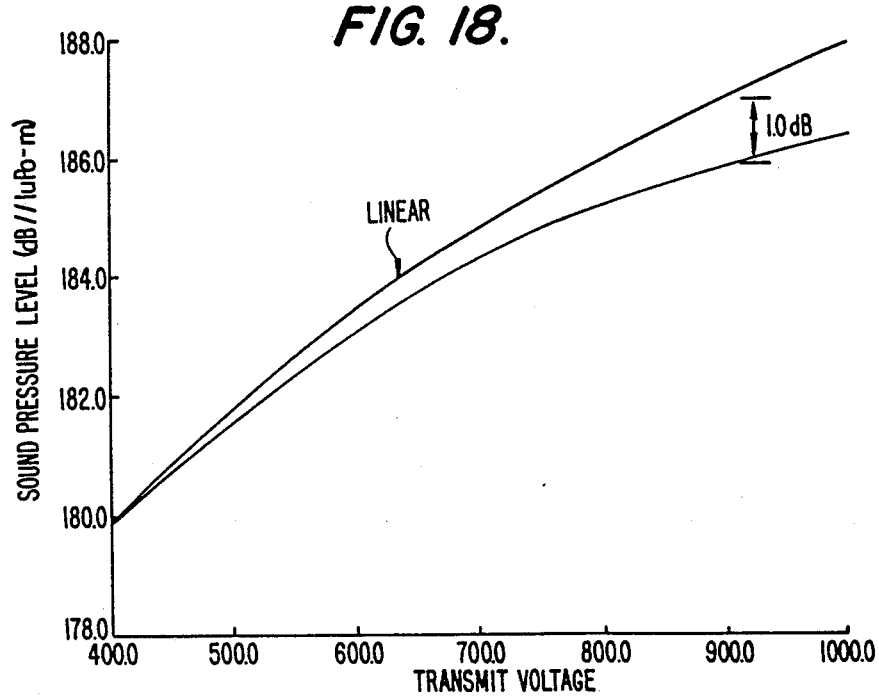
FIG. 18 illustrates the sound pressure level versus transmit voltage for a ceramic flextensional transducer.
Figure 19:
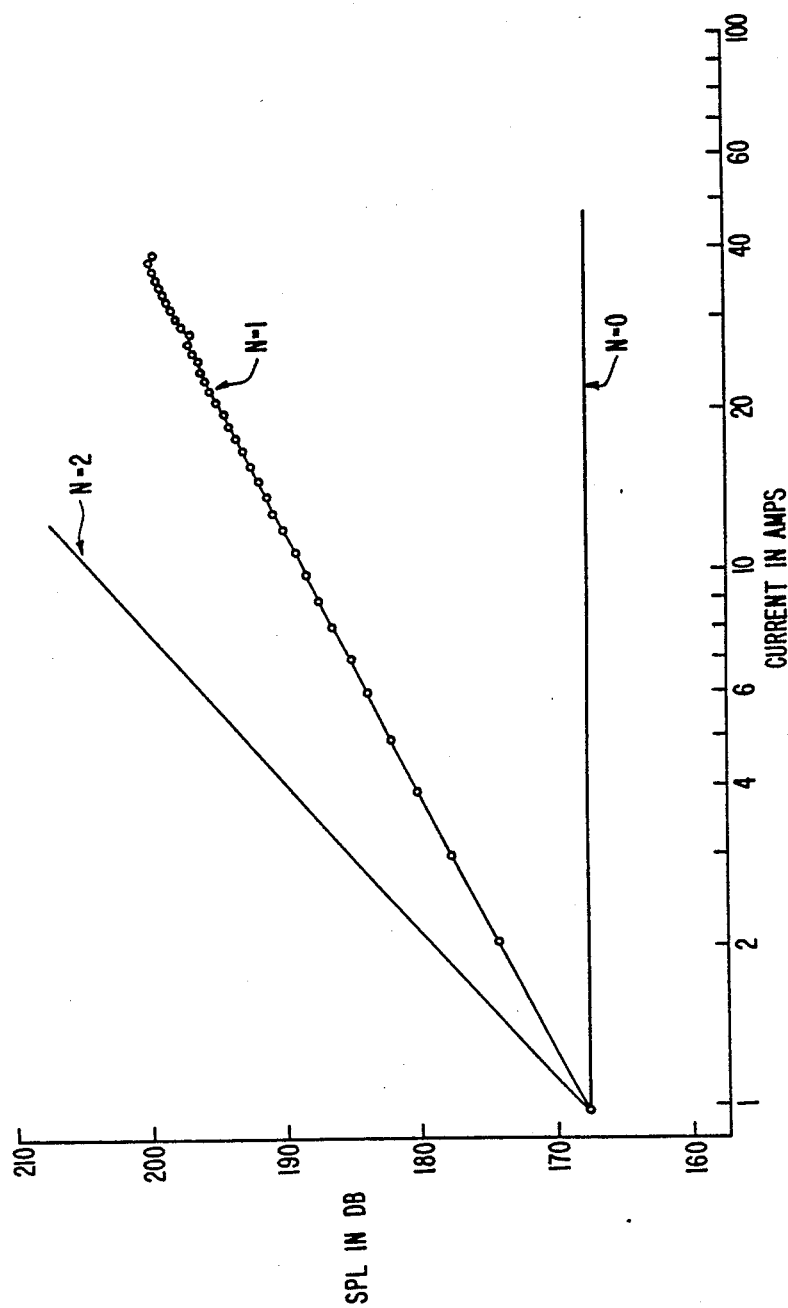
FIG. 19 illustrates the sound pressure level versus transmit current in the transducer according to the present invention.

The transmitting response of the present invention compared to a ceramic rod driven transducer of a structure similar to the present invention can be seen by comparing FIG. 16 to FIG. 17. Comparing the maximum source levels at resonance based upon a 1 dB deviation from linearity for existing experimental transducers, the rare earth transducer has an advantage of 14 dB. The present invention provides over a 10 dB peak performance improvement in the maximum source levels over a linear extrapolated commercially available ceramic transducer that is electric field limited. This method of comparison uses the linearity of the sound pressure level output for different transmit voltages. FIG. 18 illustrates that the sound pressure level versus voltage is not linear for the ceramic transducer where sound pressure level on the ordinate is plotted on a logarithmic scale (dB) versus transmit voltage plotted on the abscissa linear scale, with the result that a linear relationship is not a straight line as shown. FIG. 19 clearly indicates that the present invention provides the desired linear output relationship where both the ordinate and abscissa are logarithmic scales and a straight line indicates a constant exponent ratio, in this case, N=1.

Figure 20:
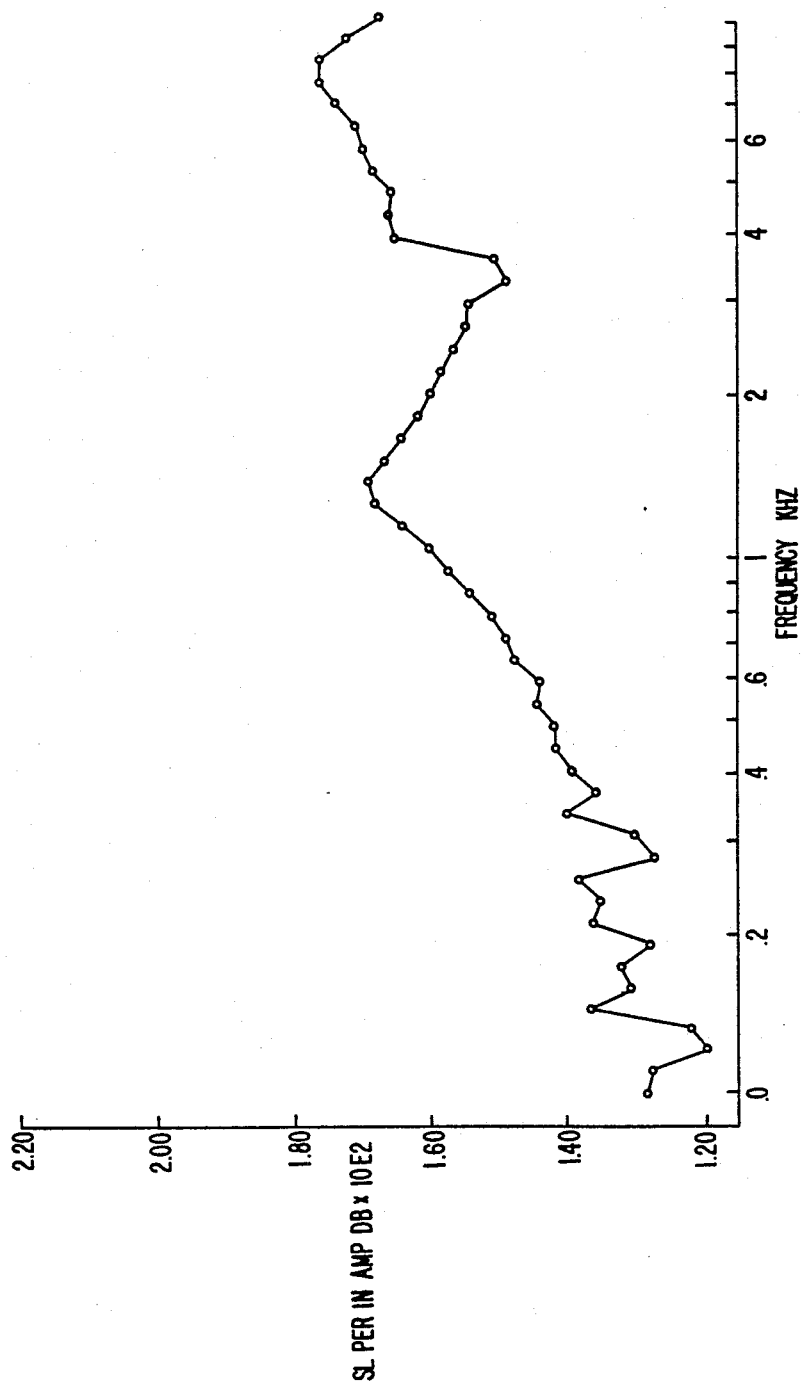
FIG. 20 illustrates the sound pressure level versus frequency for a rare earth flextensional transducer according to the present invention.

FIG. 20 illustrates that the sound pressure level per ampere of excitation produced by the present invention over a broad range of low frequencies is very good. A maximum source level of 200 dB can be achieved at the resonant frequency of 1350 Hertz for the transducer, when excited by 39 amperes RMS. When the transducer is operated continuously at a source level of 188 dB, the internal temperature rise is approximately 100° C. The polar response of the transducer is essentially omnidirectional with a slight eccentricity at 2500 Hertz.

Another advantage of the present invention is the ease of tailoring the impedance of the transducer as compared to piezoelectric ceramic driven transducers. Another important advantage is the lower drive voltage required for the present invention as compared to ceramic transducers which reduces the insulation requirements of the transducer. For example, when a ceramic transducer similar to the present invention is driven to produce a 190 dB output, the peak drive voltage is 1800 volts while the drive voltage for a 200 dB output produced by the rare earth transducer is 750 volts. The present invention also provides a higher acoustic power output for a given overall size and weight, and higher acoustic output at a lower excitation frequency as compared to prior art transducers. The present invention also has the advantage of being immune to the irreversible damage caused by overexcitation due to magnetic saturation that occurs above certain drive levels in piezoelectric ceramic materials which can suffer depolarization. The rare earth alloy material also has a much higher Curie temperature than piezoelectric ceramic material thereby allowing operation at elevated temperatures without permanent changes in the drive assemblies.

Material other than aluminum can be used for the flextensional shell, for example, lexan and Eglass or graphite composite. The electrical efficiency of the transducer can be dramatically improved by providing an electrically nonconductive shell since the aluminum shell has a large effect on the impedance of the coil and stack assemblies due to the eddy currents induced in the shell. For example, stainless steel, because of its high resistivity, improves the efficiency of the transducer.

A further improvement in the efficiency of the transducer can be accomplished by a finer lamination of the rods such as using sheet laminations to reduce eddy current paths and thereby improve the efficiency. The rods could also have shapes other than rods. A magnetic coupler between adjacent stacks could also be provided. It is also possible to fill the air space within the transducer with a fluid, such as silicon oil. The present invention can be further fine tuned to particular applications using the basic program attached as an appendix hereto. This program is an equivalent circuit analysis program which accurately simulates the performance of the transducer as various parameters are adjusted. The parameters modifiable are set forth on lines 2010-2020 of the program.

The many features and advantages of the present invention are apparent from the details of the specification and, thus, it is intended by the appended claims to cover all such features and advantages of the transducer which fall within the true spirit and scope of the invention. Further, since numerous modifications and changes will readily occur to those skilled in the art, as discussed above, it is not desired to limit the invention to the exact construction illustrated and described and, accordingly, all suitable modifications and equivalents may be resorted to, falling within the scope of the invention.

I claim:

1. A flextensional transducer, comprising:
   an elliptical flextensional shell having a major axis and a minor axis perpendicular to the major axis;
   rare earth drive means, mounted inside said shell and oriented along the major axis, for expanding said shell along the major axis and causing deflection along the minor axis; and
   rare earth biasing means, inside said shell and adjacent said drive means, for permanently and uniformly magnetically biasing said drive means along the major axis and, said rare earth biasing means comprising means compressively urged against at least one end of said rare earth drive means for transmitting to said rare earth drive means compressive prestressing force.

2. A transducer as recited in claim 1, wherein said drive means includes eddy current loss reduction means for reducing eddy currents in said drive means.

3. A transducer as recited in claim 1, wherein said shell includes stiffening means for increasing the stiffness of ends of said shell associated with the major axis.

4. A transducer as recited in claim 1, wherein said drive means includes means for mechanically biasing said drive means and said shell.

5. A flextensional transducer, comprising:
   an elliptical flextensional shell having a major axis and a minor axis perpendicular to the major axis;
   a rare earth magnetostrictive rod mounted inside said shell, oriented along the major axis of said shell;
   an electromagnetic drive coil surrounding said rod; and
   first and second rare earth permanent magnets mounted between said rod and said shell, said magnets comprising means compressively urged against at least one end of said rod for transmitting to said rod compressive prestressing force.

6. A transducer as recited in claim 5, wherein said rod is slotted.

7. A transducer as recited in claim 5, wherein an exterior of said shell at the major axis ends forms a full radius curve.

8. A transducer as recited in claim 5, wherein said electromagnet drive coil includes a slotted coil bobbin.

9. A flextensional transducer, comprising:
   an elliptical flextensional shell having a major axis and a minor axis perpendicular to the major axis; and
   first and second rare earth rod drive assemblies mounted end to end in said shell along the major axis, each drive assembly comprising:
   rare earth rods oriented along the major axis parallel with each other;
   an electomagnetic coil surrounding said rods; and
   first and second rare earth permanent magnets mounted on said rods, said magnets comprising means compressively urged against at least one end of said rods for transmitting to said rods compressive prestressing force.

10. A transducer as recited in claim 9, wherein said rods have a length that allows the first and second magnets to apply a uniform magnetic bias field throughout the length of said rods.

11. A transducer as recited in claim 9, wherein said rods are slotted.

12. A transducer as recited in claim 9, wherein said rods have a diameter at a frequency of operation that reduces eddy current losses.

13. A transducer as recited in claim 9, further comprising a shim between said drive assemblies for mechanically biasing said transducer.

14. A transducer as recited in claim 9, wherein the exterior of the major axis end of said shell has a full radius curvature.

15. A transducer as recited in claim 9, wherein said rods are laminated.

16. A transducer as recited in claim 9, wherein said electromagnetic coil includes a slotted coil bobbin.

17. A flextensional transducer, comprising:
an elliptical flextensional shell having a major axis and a minor axis perpendicular to the major axis;
rare earth drive means, mounted inside said shell, oriented along the major axis and having a first diameter, for expanding said shell along the major axis and causing deflection along the minor axis; and
rare earth biasing means, inside said shell, adjacent said drive means and having a second diameter larger than the first diameter, for permanently and uniformly magnetically biasing said drive means along the major axis and said rare earth biasing means comprising means compressively urged against at least one end of said rare earth drive means for transmitting to said rare earth drive means compressive prestressing force.

18. A flextensional transducer, comprising:
an elliptical flextensional shell having a major axis and a minor axis perpendicular to the major axis;
a rare earth magnetostrictive rod mounted inside said shell, oriented along the major axis of said shell, having first and second end surface parallel to the minor axis and perpendicular to the major axis and having a first diameter;
an electromagnetic drive coil surrounding said rod; and
first and second rare earth permanent magnets mounted between said rod and said shell, respectively abutting the first and second end surfaces and each having a second diameter larger than the first diameter, said magnets comprising means compressively urged against at least one end of said rod for transmitting to the said rod compressive prestressing force.

19. A flextensional transducer, comprising:
an elliptical flextensional shell having a major axis and a minor axis perpendicular to the major axis; and
first and second rare earth rod drive assemblies mounted end to end in said shell along the major axis, each drive assembly comprising:
rare earth rods oriented along the major axis parallel with each other, having end surfaces and having a first diameter;
an electromagnetic coil surrounding said rods; and
first and second rare earth permanent magnets mounted on the respective end surfaces of said rods and having a second diameter larger than the first diameter, said magnets comprising means compressively urged against at least one end of said rods for transmitting to said rods compressive prestressing force.

* * * * *

UNITED STATES PATENT AND TRADEMARK OFFICE
CERTIFICATE OF CORRECTION

PATENT NO. : 4,901,293

DATED : February 13, 1990

INVENTOR(S) : Philip M. Kuhn

It is certified that error appears in the above-identified patent and that said Letters Patent is hereby corrected as shown below:

FRONT PAGE "[73] Assignee: Martin Marietta, Orlando, Fla." should be --[73] Assignee: Martin Marietta Corporation, Bethesda, MD.--.

Figure 13A:
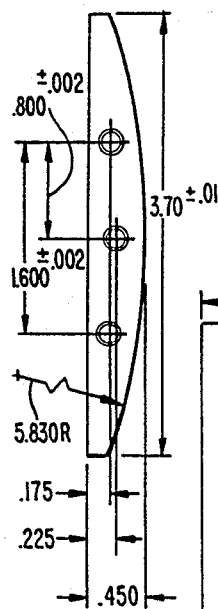
FIGS. 13A and 13B illustrate the dimensions of an end cap support beam 39.
Figure 13B:
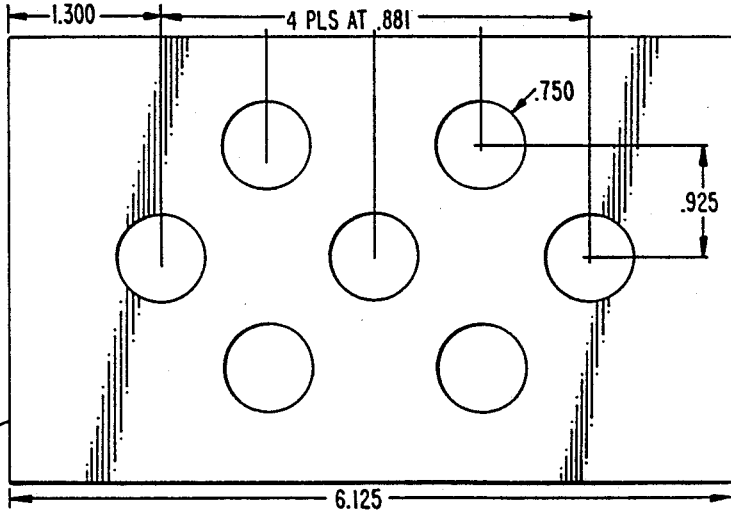
Figure 14A:
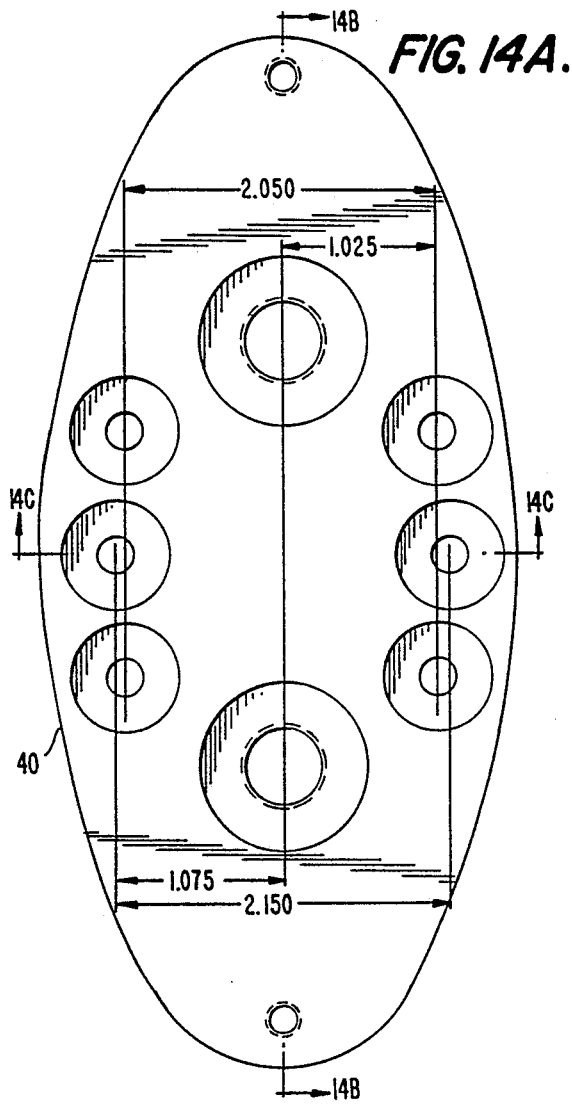
FIG. 14, including 14A-14C, illustrates an end cap 40 which is supported by a pair of beams as in FIG. 13.
Figure 14B:
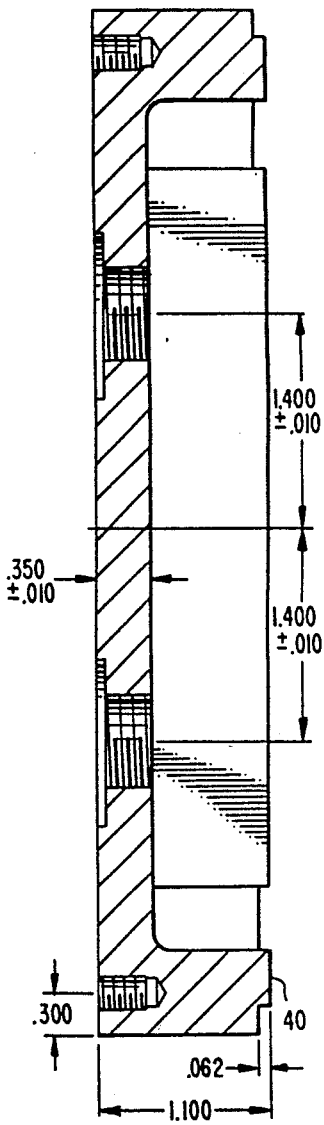
Figure 14C:
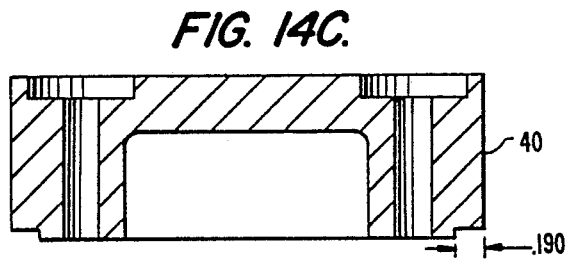

Col. 2,  line 60, start a new paragraph with "FIG. 11A;
line 61, "rod versus" should be --rod 31 versus--;
line 62, start a new paragraph with "FIG. 11B";
line 64, start a new paragraph with "FIG. 12";
line 66, start a new paragraph with "FIGS. 13A and 13B";
line 67, start a new paragraph with "FIG. 14,".

Col. 3,  line 1, start a new paragraph with "FIG. 15";
line 2, start a new paragraph with "FIG. 16";
line 4, start a new paragraph with "FIG. 17";
line 6, start a new paragraph with "FIG. 18";

UNITED STATES PATENT AND TRADEMARK OFFICE
CERTIFICATE OF CORRECTION

PATENT NO. : 4,901,293   Page 2 of 2

DATED : February 13, 1990

INVENTOR(S) : Philip M. Kuhn

It is certified that error appears in the above-identified patent and that said Letters Patent is hereby corrected as shown below:

line 8, start a new paragraph with "FIG. 19";
        line 10, start a new paragraph with "FIG. 20";
        line 47, "field The" should be --field. The--.

Col. 4, line 4, "detail in in" should be --in detail in--.

Col. 10, line 8, "surface" should be --surfaces--.

Signed and Sealed this

Eighteenth Day of June, 1991

Attest:

HARRY F. MANBECK, JR.

Attesting Officer     Commissioner of Patents and Trademarks